(12) United States Patent
Inoue et al.

(10) Patent No.: US 12,183,645 B2
(45) Date of Patent: Dec. 31, 2024

(54) ELECTRONIC COMPONENT INCLUDING PROTECTIVE LAYER

(71) Applicant: Murata Manufacturing Co., Ltd., Nagaokakyo (JP)

(72) Inventors: Kazunori Inoue, Nagaokakyo (JP);
Shintaro Otsuka, Nagaokakyo (JP);
Koichiro Kawasaki, Nagaokakyo (JP);
Hidefumi Nakanishi, Nagaokakyo (JP);
Masakazu Atarashi, Nagaokakyo (JP);
Masahiro Fukushima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 284 days.

(21) Appl. No.: 17/745,022

(22) Filed: May 16, 2022

(65) Prior Publication Data

US 2022/0278007 A1 Sep. 1, 2022

Related U.S. Application Data

(63) Continuation of application No. PCT/JP2020/041647, filed on Nov. 9, 2020.

(30) Foreign Application Priority Data

Nov. 21, 2019 (JP) .................................. 2019-210608

(51) Int. Cl.
*H01L 23/29* (2006.01)
*H01L 23/08* (2006.01)
*H01L 23/52* (2006.01)

(52) U.S. Cl.
CPC .............. *H01L 23/29* (2013.01); *H01L 23/08* (2013.01); *H01L 23/52* (2013.01)

(58) Field of Classification Search
CPC ....................................................... H01L 23/29
(Continued)

(56) References Cited

U.S. PATENT DOCUMENTS

2008/0272858 A1* 11/2008 Furihata ............. H03H 9/02984
257/E23.125
2010/0225202 A1 9/2010 Fukano et al.
(Continued)

FOREIGN PATENT DOCUMENTS

JP 2005-033689 A 2/2005
JP 2010-200198 A 9/2010
(Continued)

OTHER PUBLICATIONS

Official Communication issued in International Patent Application No. PCT/JP2020/041647, mailed on Jan. 12, 2021.

*Primary Examiner* — Ajay Arora
(74) *Attorney, Agent, or Firm* — Keating & Bennett, LLP

(57) ABSTRACT

An electronic component includes a substrate, a functional element on the substrate, a support body, a covering portion, and a protective layer covering the covering portion. The support body is provided on the substrate and around a region in which the functional element is located. The covering portion faces the substrate and is supported by the support body. The substrate, the support body, and the covering portion define a hollow space. The functional element is located in the hollow space. In the support body, a surface opposite to a surface facing the substrate is a first surface, and a portion of the protective layer is in contact with the first surface of the support body without the covering portion being interposed.

20 Claims, 3 Drawing Sheets

(58) Field of Classification Search
USPC .......................................................... 257/700
See application file for complete search history.

(56) References Cited

U.S. PATENT DOCUMENTS

| | | |
|---|---|---|
| 2012/0012356 A1 | 1/2012 | Satoh et al. |
| 2014/0118093 A1* | 5/2014 | Yamashita ........... H03H 9/1092 |
| | | 333/186 |
| 2014/0191617 A1 | 7/2014 | Ohashi et al. |
| 2017/0359049 A1* | 12/2017 | Toyota ................... H03H 9/059 |
| 2019/0356299 A1 | 11/2019 | Kawasaki |

FOREIGN PATENT DOCUMENTS

| | | |
|---|---|---|
| JP | 2011-049354 A | 3/2011 |
| JP | 2013-013526 A | 1/2013 |
| JP | 5849130 B2 | 1/2016 |
| JP | 2018-207524 A | 12/2018 |
| WO | 2010/114115 A1 | 10/2010 |
| WO | 2018/143045 A1 | 8/2018 |

* cited by examiner

ELECTRONIC COMPONENT INCLUDING PROTECTIVE LAYER

CROSS REFERENCE TO RELATED APPLICATIONS

This application claims the benefit of priority to Japanese Patent Application No. 2019-210608 filed on Nov. 21, 2019 and is a Continuation Application of PCT Application No. PCT/JP2020/041647 filed on Nov. 9, 2020. The entire contents of each application are hereby incorporated herein by reference.

BACKGROUND OF THE INVENTION

1. Field of the Invention

The present disclosure relates to an electronic component and more specifically relates to the structure of an electronic component having a wafer level package (WLP) structure and including a hollow space in which a functional element is located.

2. Description of the Related Art

Japanese Patent No. 5849130, Japanese Unexamined Patent Application Publication No. 2013-135264, and Japanese Unexamined Patent Application Publication No. 2018-207524 disclose surface acoustic wave (SAW) devices having a WLP structure and having a piezoelectric substrate on which a comb-shaped electrode, that is, an interdigital transducer (IDT) electrode is disposed. Such acoustic wave devices include a hollow space so that the IDT electrode can perform excitation on the piezoelectric substrate.

On an upper surface of a covering portion forming the hollow space, a protective layer (an insulating layer, a sealing film) for improving insulation properties and/or moisture-proof properties may further be provided.

SUMMARY OF THE INVENTION

Regarding electronic components such as the surface acoustic wave devices described in the above-mentioned patent documents, there is required a connection electrode for connecting a functional element (IDT electrode) disposed in the hollow space and an external device to one another. Such a connection electrode is typically formed as follows. A through hole is formed in the protective layer, in the covering portion, and in a support body for supporting the covering portion, and the through hole is filled with a metal conductor. At this time, if the close contact performance at the interface between the protective layer and the covering portion is decreased by, for example, peeling-off being caused between the protective layer and the covering portion, the protection characteristics of the protective layer may decrease.

Preferred embodiments of the present invention improve close contact performance of a protective layer on an electronic component including a hollow space in which a functional element is located and thus to prevent a decrease in protection characteristics of the protective layer.

An electronic component according to the present disclosure includes a substrate, a functional element on the substrate, a support body, a covering portion, and a protective layer covering the covering portion. The support body is located on the substrate and around a region in which the functional element is located. The covering portion faces the substrate and is supported by the support body. The substrate, the support body, and the covering portion define a hollow space. The functional element is located in the hollow space. When, in the support body, a surface opposite to a surface facing the substrate is designated as a first surface, a portion of the protective layer is in contact with the first surface of the support body without the covering portion being interposed.

Regarding an electronic component according to a preferred embodiment of the present disclosure, a portion of the protective layer covering the covering portion is directly connected to the support body without the covering portion being interposed. That is, the protective layer includes a region in which the covering portion is located between the protective layer and the support body and also has a region in direct contact with the support body.

Due to such a configuration, the close contact performance of the protective layer can be improved compared with a configuration in which the protective layer is in contact with only the covering portion. Thus, the protection characteristics exhibited by the protective layer can be maintained and not decreased.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
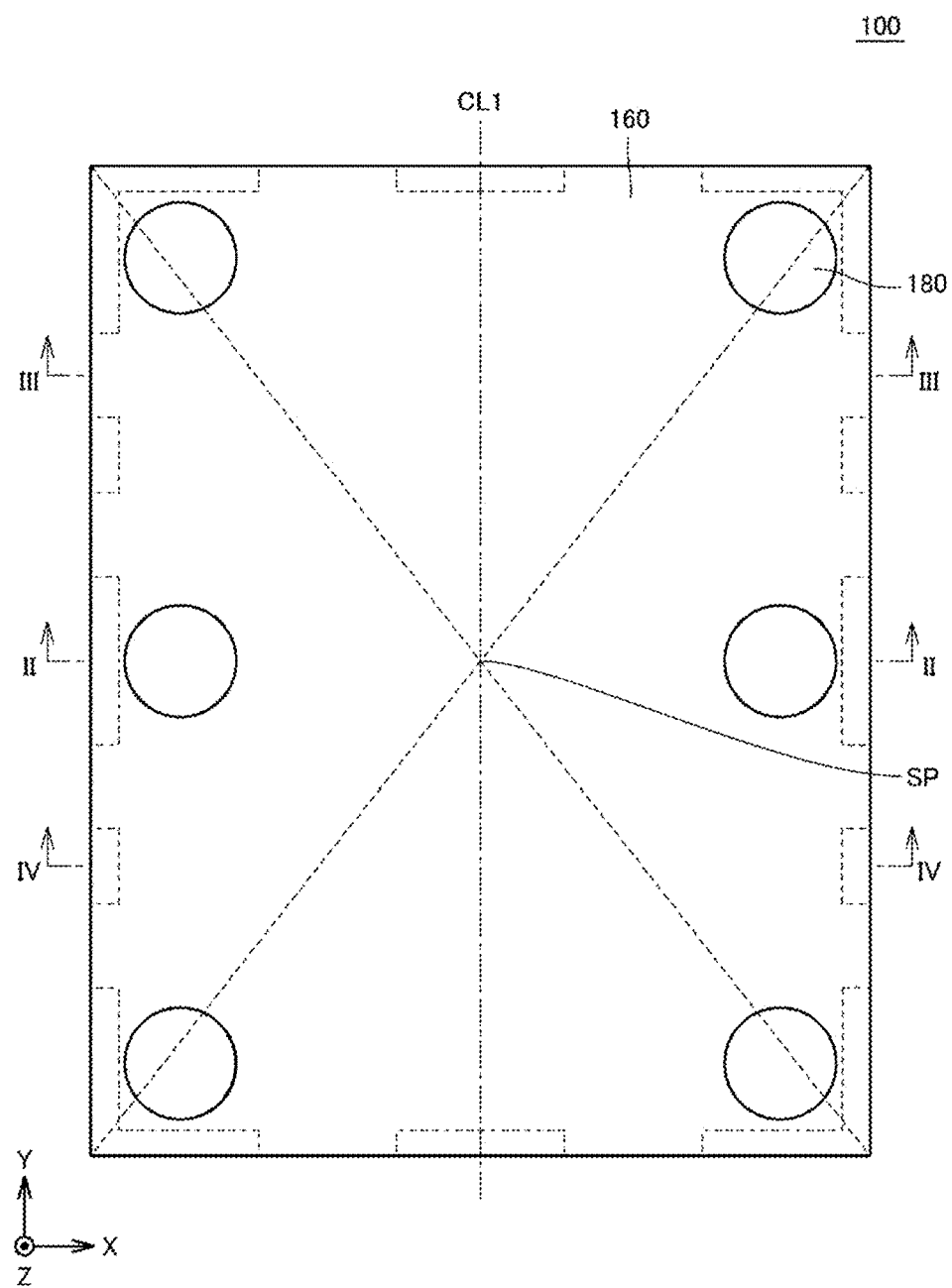
FIG. 1 is a plan view of an electronic component according to a preferred embodiment of the present invention.

Hereinafter, preferred embodiments of the present disclosure will be described in detail with reference to the accompanying drawings. Note that the same or equivalent portions in the drawings are denoted by the same reference, and the description thereof will not be repeated.

Figure 2:
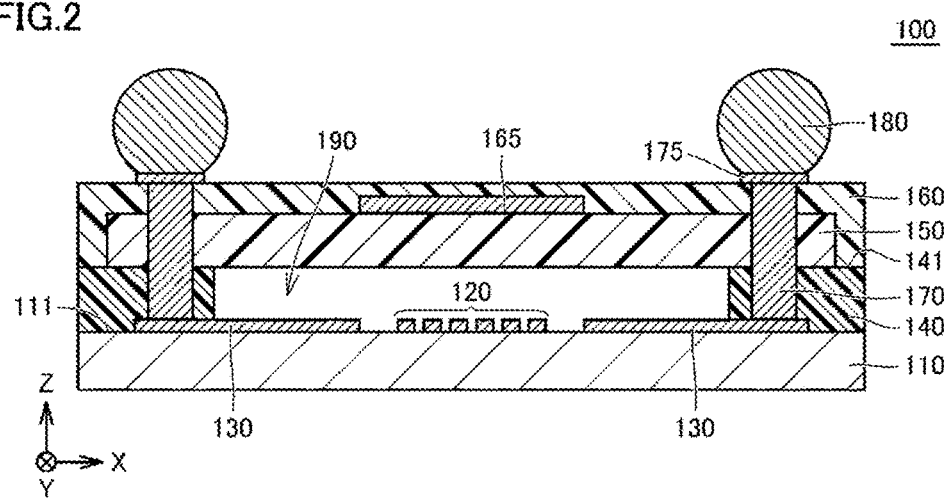
FIG. 2 is a sectional view taken along line II-II in FIG. 1.
Figure 3:
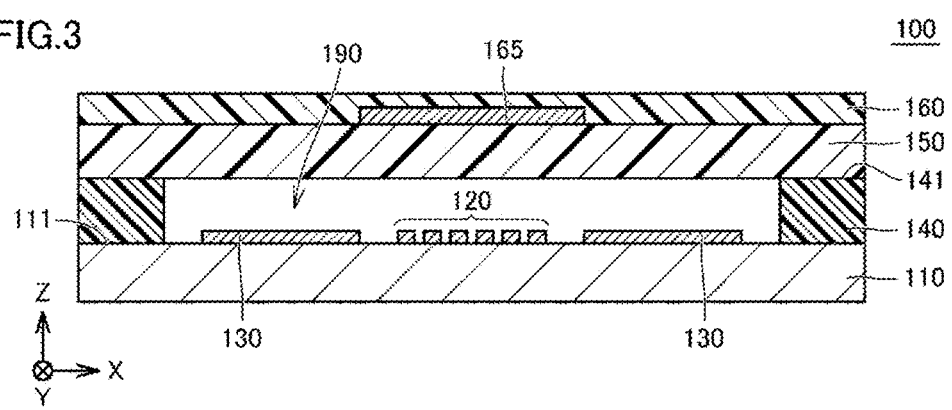
FIG. 3 is a sectional view taken along line in FIG. 1.
Figure 4:
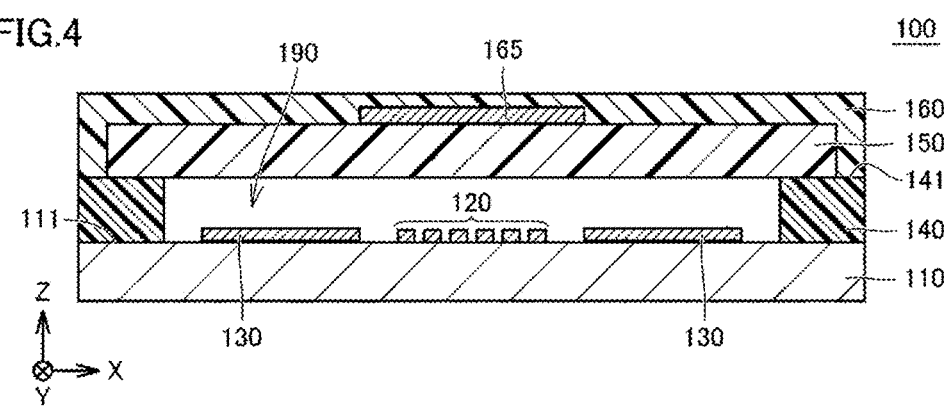
FIG. 4 is a sectional view taken along line IV-IV in FIG. 1.

FIG. 1 is a plan view of an electronic component 100 according to the present preferred embodiment. In addition, FIG. 2 is a sectional view taken along line II-II in FIG. 1, and FIG. 3 is a sectional view taken along line III-III in FIG. 1. Moreover, FIG. 4 is a sectional view taken along line IV-IV in FIG. 1.

Referring to FIGS. 1 to 4, the electronic component 100 includes a substrate 110, a functional element 120, a support body 140, a covering portion 150, a protective layer 160, and a connection electrode 170 that is located in the support body 140. Note that, in the present preferred embodiment, the case where the electronic component 100 is a surface acoustic wave (SAW) device will be described. Thus, the case where a piezoelectric substrate defines and functions as the substrate 110, and an IDT electrode is included as the functional element 120 will be described as an example. Hereinafter, the substrate 110 is sometimes referred to as the "piezoelectric substrate 110".

The electronic component 100 has a substantially rectangular shape when viewed in plan view in the normal direction of the substrate 110. In the drawings, the Z-axis is the normal direction of the substrate 110, the X-axis is a direction parallel to one side of the substrate 110 when viewed in plan view, and the Y-axis is the direction parallel to a side orthogonal to the X-axis. In addition, in the drawings, the positive Z-axis direction and the negative Z-axis direction are sometimes referred to as the upper surface side and the lower surface side of the electric component 100, respectively.

The piezoelectric substrate 110 is made of a piezoelectric single crystal material such as lithium tantalate ($LiTaO_3$), lithium niobate ($LiNbO_3$), alumina, silicon (Si), or sapphire or made of a piezoelectric layered material made of $LiTaO_3$ or $LiNbO_3$. Plural functional elements 120 are provided on an upper surface 111 of the piezoelectric substrate 110. The functional elements 120 include a pair of IDT electrodes made of an electrode material, such as a single metal of at least one of aluminum, copper, silver, gold, titanium, tungsten, platinum, chromium, nickel, and molybdenum, or an alloy containing, as a main component, a metal of the above-described metal examples. The piezoelectric substrate 110 and the functional elements (IDT electrodes) 120 define a surface acoustic wave (SAW) resonator.

In the piezoelectric substrate 110, on the upper surface 111 on which the functional elements 120 are provided, there is provided a wiring electrode 130 to electrically connect the functional elements 120 to one another and to connect the functional elements 120 to the connection electrode 170.

The support body 140 has a wall shape surrounding the periphery of the functional elements 120 and protrudes from the upper surface 111 of the piezoelectric substrate 110 in the positive Z-axis direction. The support body 140 is made of an insulating resin such as epoxy or polyimide.

The covering portion 150 is supported by the support body 140 and disposed so as to face the upper surface 111 of the piezoelectric substrate 110. The covering portion 150 is made of an insulating resin material including, as a main component, epoxy, polyimide, acrylic, or urethane, for example. In addition, other than the above-described resins, a metal may be partially used for the covering portion 150. A hollow space 190 is defined by the piezoelectric substrate 110, the support body 140, and the covering portion 150. The functional elements 120 are disposed in the hollow space 190.

The protective layer 160 is provided on the upper surface side of the covering portion 150 (the surface opposite to the hollow space 190) so as to cover the covering portion 150. The protective layer 160 is disposed to improve the insulation properties, the moisture-proof properties, and the pressure-proof properties of the electronic component 100. The protective layer 160 is made of an insulating resin such as epoxy or polyimide.

The connection electrode 170 includes a through hole (a hole passing through) that is provided in the support body 140, in the covering portion 150, and in the protective layer 160, being filled with or being plated with a conductive material such as copper. The connection electrode 170 is electrically connected to the functional elements 120 with the wiring electrode 130 interposed therebetween. The connection electrode 170 is further electrically connected to a terminal electrode 175 disposed on the upper surface side of the support body 140. The terminal electrode 175 is electrically connected to an external device or a mounting substrate, which is not illustrated, by using a connector such as a solder ball 180. A rewiring layer 165 may also be provided between the covering portion 150 and the protective layer 160.

Figure 5:
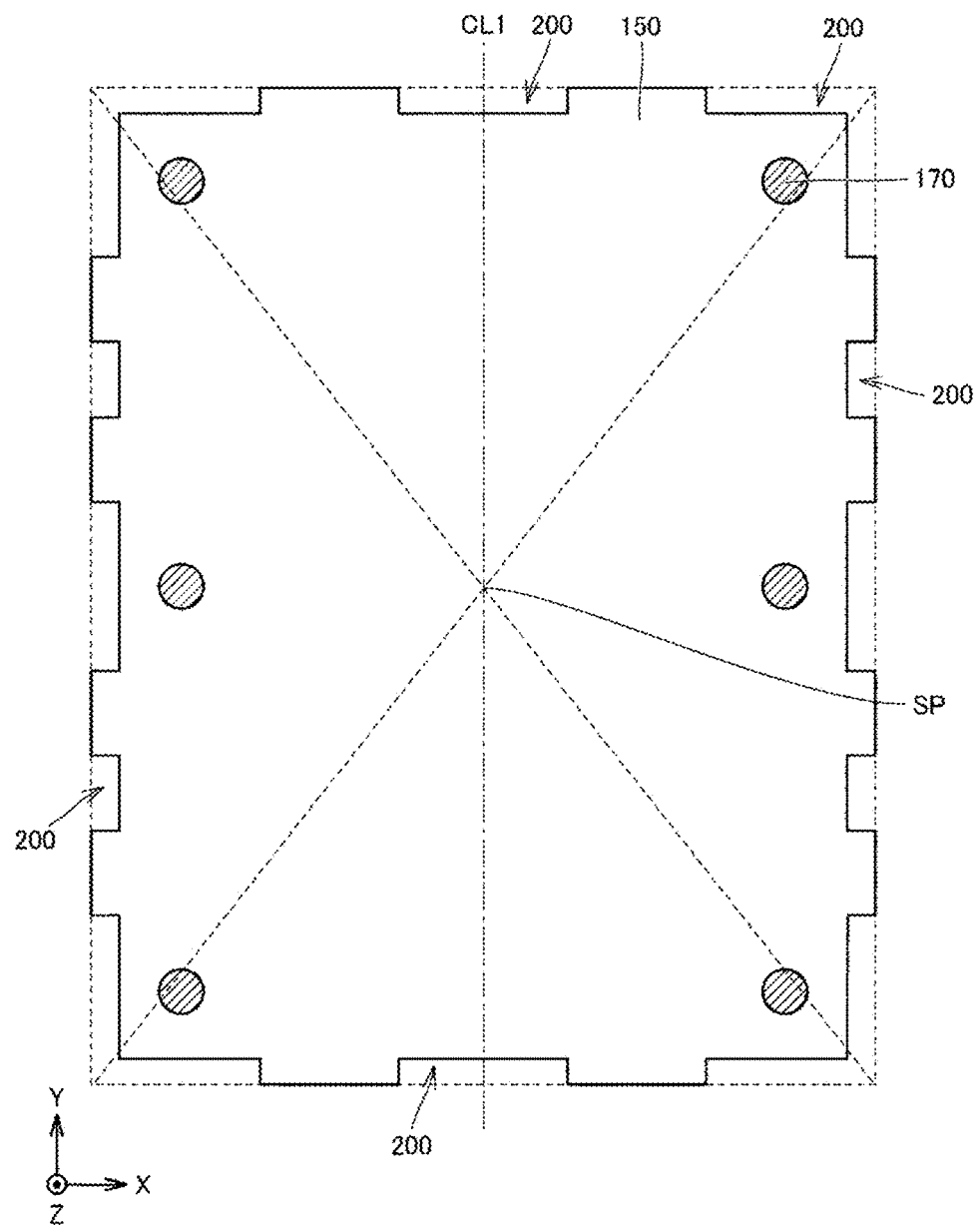
FIG. 5 is a plan view of a covering portion of the electronic component according to a preferred embodiment of the present invention.

FIG. 5 is a plan view of the covering portion 150 when the protective layer 160 is removed. The covering portion 150 has a substantially rectangular shape as a whole when viewed in plan view in the Z-axis direction. Plural cutout portions 200 are provided in an outer peripheral end portion of the covering portion 150. When, regarding the support body 140, the surface opposite to the surface on the substrate 110 side is a first surface 141, the protective layer 160 is directly connected to the first surface 141 of the support body 140 without the covering portion 150 being interposed, in regions having the cutout portions 200, as in the sectional views of FIG. 2 and FIG. 4. That is, the protective layer 160 includes a region in which the covering portion 150 is disposed between the protective layer 160 and the support body 140 as in the sectional view of FIG. 3 and also has a region being in direct contact with the support body 140 as in the sectional views of FIG. 2 and FIG. 4. Note that the protective layer 160 and the support body 140 are preferably made of the same material to improve the close contact performance of the protective layer 160 and the support body 140.

The cutout portions 200 are provided at positions so as to be arranged, when the covering portion 150 is viewed in plan view in the Z-axis direction, line-symmetrically about a virtual line CL1 that passes through a center SP of the piezoelectric substrate 110 and is parallel to one side of the piezoelectric substrate 110. Instead of such a condition or in addition to the condition, the cutout portions 200 are provided at positions so as to be arranged point-symmetrically about the center SP of the piezoelectric substrate 110. By the cutout portions 200 being arranged symmetrically as described above, the symmetry of the degree of close contact between the protective layer 160 and the covering portion 150 or the support body 140 is improved, and peeling-off can thus be suppressed or prevented from being caused by, for example, distortion due to variation in the degree of close contact.

Regarding such an above-described electronic component, the functional element provided in the hollow space is electrically connected to an external device with the connection electrode interposed therebetween. As described above, the connection electrode includes the through hole provided in the protective layer, the covering portion, and the support body, being filled with a conductive material. When the through hole is formed by processing, when the filling of the conductive material is performed, or when the electronic component is mounted on, for example, a mounting substrate by the solder ball being heated, a mechanical or thermal load is applied to an interface of the layered structure of the above-described elements, and peeling-off may be caused at the interface. If, in particular, the protective layer peels off, moisture may enter the hollow space from a place at which the protective layer peels off, thus causing corrosion of the functional element, and, in the electronic component 100, the electrical characteristics may be decreased by the insulation properties decreasing.

Regarding the electronic component 100 according to the present preferred embodiment, as FIG. 5 illustrates, the plural cutout portions 200 are provided in an outer peripheral end surface of the covering portion 150, and, at the cutout portions 200, the protective layer 160 is directly connected to the first surface 141 of the support body 140 without the covering portion 150 being interposed. Thus, even if peeling-off is caused at a portion of the interface between the covering portion 150 and the protective layer 160, the protective layer 160, the covering portion 150, and the support body 140 can maintain close contact, as a whole, by the protective layer 160 being directly connected to the support body 140. Moreover, when the cutout portions 200 are formed, the side surfaces of the cutout portions 200 increase the contact area between the protective layer 160 and the covering portion 150. In addition, a force exerted in a direction in which the protective layer 160 presses down the covering portion 150 is applied to the cutout portions 200 due to the curing shrinkage of the protective layer 160 when being formed. Thus, the degree of close contact between the protective layer 160 and the covering portion 150 is increased compared with the case not having any cutout portions 200.

In addition, when the protective layer 160 is connected to the piezoelectric substrate 110, stress concentration is caused at the interface between the protective layer 160 and the piezoelectric substrate 110, and a crack may occur in the piezoelectric substrate 110. However, in the present preferred embodiment, the protective layer 160 is not connected to the piezoelectric substrate 110, and a crack can be suppressed or prevented from occurring in the piezoelectric substrate 110.

Note that the protective layer 160 is likely to peel off in the situation where the connection electrode 170 is formed or in the situation where the electronic component 100 is mounted, as described above. That is, such peeling-off is likely to be caused in the vicinity of the connection electrode 170. Thus, the cutout portion 200 is preferably provided at a position in the vicinity of the connection electrode 170.

In addition, a corner portion of the electronic component 100 is likely to receive external mechanical contact; thus, there is also a high probability that peeling-off is caused. Thus, the cutout portion 200 is preferably provided in such a corner portion of the electronic component 100.

Note that, although, in the above description, the case where the electronic component is a surface acoustic wave (SAW) device is described as an example, preferred embodiments of the present disclosure may also be applicable to, other than such a SAW device, any electronic component having a configuration in which a hollow space is located in the component, and a functional element is provided in the hollow space. The electronic component may be a bulk acoustic wave (BAW) device and may also be a MEMS device provided with a miniature sensor or actuator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a substrate;
    a functional element on the substrate;
    a support body provided on the substrate and around a region in which the functional element is located;
    a covering portion facing the substrate and supported by the support body; and
    a protective layer covering the covering portion; wherein
    the substrate, the support body, and the covering portion define a hollow space;
    the functional element is located in the hollow space;
    when, in the support body, a surface opposite to a surface facing the substrate is designated as a first surface, a portion of the protective layer is in contact with the first surface of the support body without the covering portion being interposed;
    the protective layer is in contact with a side surface of the covering portion, the side surface extending in a direction that intersects with the first surface of the support body; and
    the first surface of the support body is in contact with the covering portion.

2. The electronic component according to claim 1, wherein a plurality of cutout portions are provided in an outer peripheral end portion of the covering portion, and the protective layer and the support body are in contact with one another at each of the plurality of cutout portions.

3. The electronic component according to claim 2, further comprising:
    a connection electrode that extends through the protective layer, the covering portion, and the support body and electrically connects an external device and the functional element to one another; wherein
    each of the plurality of cutout portions is at a position in a vicinity of the connection electrode.

4. The electronic component according to claim 2, wherein, when the electronic component is viewed in plan view in a normal direction of the substrate, a corresponding one of the plurality of cutout portions is provided in a corner portion of the covering portion.

5. The electronic component according to claim 2, wherein
    when the electronic component is viewed in plan view in a normal direction of the substrate;
    the substrate has a rectangular or substantially rectangular shape; and
    the plurality of cutout portions are positioned line-symmetrically about a virtual line passing through a center of the substrate and being parallel or substantially parallel to one side of the substrate.

6. The electronic component according to claim 2, wherein
    when the electronic component is viewed in plan view in a normal direction of the substrate;
    the substrate has a rectangular shape or a substantially rectangular shape; and
    the plurality of cutout portions are positioned point-symmetrically about a center of the substrate.

7. The electronic component according to claim 1, wherein the protective layer and the support body are made of a same material.

8. The electronic component according to claim 1, further comprising a rewiring layer between the covering portion and the protective layer.

9. The electronic component according to claim 1, wherein
    the substrate is a piezoelectric substrate;
    the functional element includes an interdigital transducer electrode; and
    the piezoelectric substrate and the interdigital transducer electrode define a surface acoustic wave resonator.

10. The electronic component according to claim 1, wherein the electronic component is a surface acoustic wave device.

11. The electronic component according to claim 1, wherein the electronic component is a surface acoustic wave resonator.

12. The electronic component according to claim 1, wherein the substrate is made of one of a piezoelectric single crystal material or a piezoelectric layered material.

13. The electronic component according to claim 9, wherein the interdigital transducer electrode is made of a single metal or an alloy of a metal.

14. The electronic component according to claim 1, wherein a plurality of the functional elements are provided on the substrate and a wiring electrode is provided on the substrate to connect the functional elements.

15. The electronic component according to claim 14, wherein the support body surrounds the plurality of the functional elements.

16. The electronic component according to claim 1, wherein the covering portion includes at least one of epoxy, polyimide, acrylic or urethane.

17. The electronic component according to claim 1, wherein the protective layer is made of an insulating resin.

18. The electronic component according to claim 3, wherein the connection electrode includes a through hole including therein a conductive material.

19. The electronic component according to claim 15, further comprising a terminal electrode on the support body and connected to a connection electrode that extends through the protective layer, the covering portion, and the support body and electrically connects an external device and the functional element to one another.

20. The electronic component according to claim 15, wherein the protective layer is directly connected to the support body.

* * * * *